United States Patent
Han et al.

(10) Patent No.: US 10,840,302 B2
(45) Date of Patent: Nov. 17, 2020

(54) IMAGE SENSOR INCLUDING NANOSTRUCTURE COLOR FILTER

(71) Applicants: SAMSUNG ELECTRONICS CO., LTD., Suwon-si (KR); CALIFORNIA INSTITUTE OF TECHNOLOGY, Pasadena, CA (US)

(72) Inventors: Seunghoon Han, Seoul (KR); Kwanghee Lee, Hwaseong-si (KR); Yongwan Jin, Seoul (KR); Yongsung Kim, Suwon-si (KR); Changgyun Shin, Anyang-si (KR); Jeongyub Lee, Yongin-si (KR); Amir Arbabi, Pasadena, CA (US); Andrei Faraon, Pasadena, CA (US); Yu Horie, Pasadena, CA (US)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 15/473,767

(22) Filed: Mar. 30, 2017

(65) Prior Publication Data
US 2017/0287981 A1    Oct. 5, 2017

Related U.S. Application Data

(60) Provisional application No. 62/315,284, filed on Mar. 30, 2016.

(30) Foreign Application Priority Data

Nov. 10, 2016    (KR) ........................ 10-2016-0149555

(51) Int. Cl.
H01L 27/146    (2006.01)
H01L 27/30    (2006.01)

(52) U.S. Cl.
CPC ...... *H01L 27/307* (2013.01); *H01L 27/14621* (2013.01); *H01L 27/14636* (2013.01); *H01L 27/14645* (2013.01)

(58) Field of Classification Search
CPC ............. H01L 27/307; H01L 27/14621; H01L 27/14645; H01L 27/14636
See application file for complete search history.

(56) References Cited

U.S. PATENT DOCUMENTS 8,890,984 B2    11/2014    Konno et al.
9,054,001 B2    6/2015    Fukunaga
(Continued)

FOREIGN PATENT DOCUMENTS

| JP | 2014-64196 A | 4/2014 |
| KR | 10-2009-0061199 A | 6/2009 |
| KR | 10-2013-0131730 A | 12/2013 |

*Primary Examiner* — Benjamin Tzu-Hung Liu
(74) *Attorney, Agent, or Firm* — Sughrue Mion, PLLC

(57) ABSTRACT

An image sensor includes a first light sensor layer including light sensing cells configured to sense first light of an incident light and generate electrical signals based on the sensed first light, and a color filter array layer disposed on the first light sensor layer, and including color filters respectively facing the light sensing cells. The image sensor further includes a second light sensor layer disposed on the color filter array layer, and configured to sense second light of the incident light and generate an electrical signal based on the sensed second light. Each of the color filters includes a nanostructure including a first material having a first refractive index, and a second material having a second refractive index greater than the first refractive index, the first material and the second material being alternately disposed with a period.

26 Claims, 9 Drawing Sheets

(56) References Cited

U.S. PATENT DOCUMENTS

| | | | |
|---|---|---|---|
| 2011/0116010 A1* | 5/2011 | Nagata | G02B 6/005 |
| | | | 349/62 |
| 2013/0057738 A1* | 3/2013 | Konno | G02B 5/203 |
| | | | 348/294 |
| 2016/0050359 A1* | 2/2016 | Nakata | H01L 27/14621 |
| | | | 250/201.2 |
| 2016/0156883 A1 | 6/2016 | Han et al. | |
| 2016/0247860 A1* | 8/2016 | Ito | H01L 51/4253 |
| 2017/0110517 A1* | 4/2017 | Wada | H01L 27/307 |

* cited by examiner

IMAGE SENSOR INCLUDING NANOSTRUCTURE COLOR FILTER

CROSS-REFERENCE TO RELATED APPLICATION

This application claims priority from U.S. Provisional Application No. 62/315,284, filed on Mar. 30, 2016, in the U.S. Patent and Trademark Office, and Korean Patent Application No. 10-2016-0149555, filed on Nov. 10, 2016, in the Korean Intellectual Property Office, the disclosures of which are incorporated herein by reference in their entireties.

STATEMENT REGARDING FEDERALLY SPONSORED RESEARCH OR DEVELOPMENT

This invention was made with government support under Grant No. 1512266 awarded by the National Science Foundation. The government has certain rights in the invention.

BACKGROUND

1. Field

Apparatuses relate to an image sensor including a nanostructure color filter.

2. Description of the Related Art

The number of pixels in an image sensor is on an increasing trend. Pixel miniaturization is performed to include more pixels with respect to an area of the image sensor. Issues regarding pixel miniaturization are securing pixel intensity and eliminating noise. Recently, with the introduction of a back illuminated structure (BIS) sensor of a cell separation type, much progress has been achieved in relation to these issues.

However, a structure including optical components that collect color light proceeding toward an optical sensor, such as a color filter and a micro-lens, is one of the marginal factors of the pixel miniaturization. A thickness of the color filter of an absorption type and a thickness of the micro-lens, which is placed on the color filter and guides light toward the color filter, are some of the constraint factors.

SUMMARY

Example embodiments may address at least the above problems and/or disadvantages and other disadvantages not described above. Also, the example embodiments are not required to overcome the disadvantages described above, and may not overcome any of the problems described above.

An image sensor including a color filter having a structure adequate for pixel miniaturization is provided.

According to an aspect of an example embodiment, there is provided an image sensor including a first light sensor layer including light sensing cells configured to sense first light of an incident light and generate electrical signals based on the sensed first light, and a color filter array layer disposed on the first light sensor layer, and including color filters respectively facing the light sensing cells. The image sensor further includes a second light sensor layer disposed on the color filter array layer, and configured to sense second light of the incident light and generate an electrical signal based on the sensed second light. Each of the color filters includes a nanostructure including a first material having a first refractive index, and a second material having a second refractive index greater than the first refractive index, the first material and the second material being alternately disposed with a period.

The sensed second light may have a first color, the color filters may include a first color filter configured to selectively transmit third light having a second color, and a second color filter configured to selectively transmit fourth light having a third color, and the first color filter and the second color filter may respectively include nanostructures having different periods.

A fill factor of the second material included in the first color filter may be different from a fill factor of the second material included in the second color filter.

The color filter array layer may further include a first substrate including a third material having a third refractive index less than the second refractive index, and the nanostructure may be disposed on the first substrate.

The color filter array layer may further include a second substrate including a fourth material having a fourth refractive index less than the second refractive index, and the nanostructure may be interposed between the first substrate and the second substrate.

The first material may include one of polymer and silicon dioxide ($SiO_2$), and the second material may include one of silicon (Si), silicon nitride ($Si_3N_4$), gallium phosphide (GaP), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

The first material and the second material may be two-dimensionally alternately disposed.

Two directions of the nanostructure included in each of pixels of the image sensor may vary based on a location of each of the pixels.

The second material may have a stripe shape structure that is one-dimensionally repeatedly disposed, and a longitudinal direction of the stripe shape structure of the nanostructure included in each of pixels of the image sensor may vary based on a location of each of the pixels.

Each of the light sensing cells may include an inorganic photodiode, and the second light sensor layer may include an organic photodiode.

A fill factor may denote an area ratio of the second material included in the nanostructure included in each of pixels of the image sensor, and vary based on a location of each of the pixels.

Shapes and arrangements of the first material and the second material may be such that the nanostructure collects incident light.

The second refractive index may be greater than the first refractive index by about 1.5 or more.

According to an aspect of an example embodiment, there is provided an image sensor including a first light sensor layer including light sensing cells configured to sense first light of an incident light and generate electrical signals based on the sensed first light, and a second light sensor layer disposed on the first light sensor layer, and configured to sense second light of the incident light and generate an electrical signal based on the sensed second light. The image sensor further includes a color filter array layer disposed on the second light sensor layer, and including color filters respectively corresponding to the light sensing cells, and each of the color filters may include a nanostructure including a first material having a first refractive index and a second material having a second refractive index greater than the first refractive index, the first material and the second material being alternately disposed with a period.

The sensed second light may have a first color, the color filters may include a first color filter configured to selectively absorb or reflect third light having a second color, and a second color filter configured to selectively absorb or reflect fourth light having a third color, and the first color filter and the second color filter may respectively include nanostructures having different periods.

A fill factor of the second material included in the first color filter may be different from a fill factor of the second material included in the second color filter.

The color filter array layer may further include a first substrate including a third material having a third refractive index less than the second refractive index, and the nanostructure may be disposed on the first substrate.

The color filter array layer may further include a second substrate including a fourth material having a fourth refractive index less than the second refractive index, and the nanostructure may be interposed between the first substrate and the second substrate.

The first material may include one of polymer and silicon dioxide ($SiO_2$), and the second material may include one of silicon (Si), silicon nitride ($Si_3N_4$), gallium phosphide (GaP), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

The first material and the second material may be two-dimensionally alternately disposed.

Two directions of the nanostructure included in each of pixels of the image sensor may vary based on a location of each of the pixels.

The second material may have a stripe shape structure that is one-dimensionally repeatedly disposed, and a longitudinal direction of the stripe shape structure of the nanostructure included in each of pixels of the image sensor may vary based on a location of each of the pixels.

Each of the light sensing cells may include an inorganic photodiode, and the second light sensor layer may include an organic photodiode.

A fill factor may denote an area ratio of the second material included in the nanostructure included in each of pixels of the image sensor, and may vary based on a location of each of the pixels.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
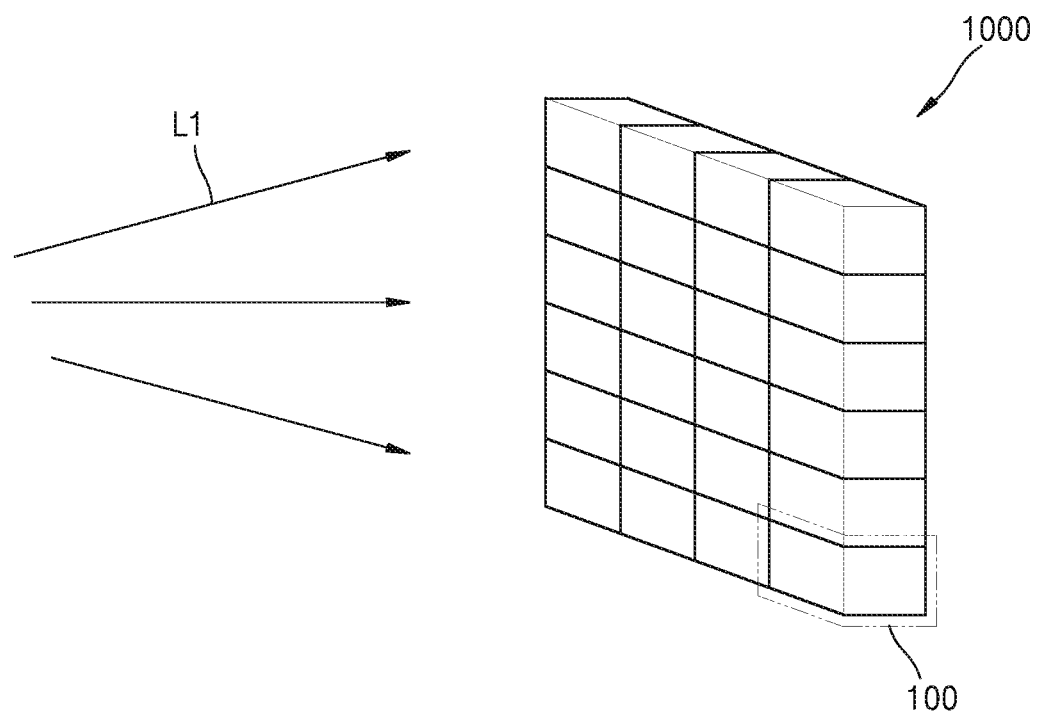
FIG. 1 is a diagram of an image sensor according to an example embodiment.

Reference will now be made in detail to example embodiments, which are illustrated in the accompanying drawings, wherein like reference numerals refer to like elements throughout. In this regard, the present embodiments may have different forms and may not be construed as being limited to the descriptions set forth herein. Accordingly, the example embodiments are described below, by referring to the figures, to explain aspects. Expressions such as "at least one of," when preceding a list of elements, modify the entire list of elements and do not modify the individual elements of the list.

The inventive concept will now be described more fully with reference to the accompanying drawings, in which example embodiments of the inventive concept are shown. Like reference numerals in the drawings denote like components, and sizes of components in the drawings may be exaggerated for convenience of explanation. Various changes in form and details may be made in the example embodiments. In the case in which a position relationship between two items is described with the terms "on ~" or "on the top of ~," one item may be not only directly on the other item while being in contact with the other item but may also be on the other item without being in contact with the other item.

FIG. 1 is a diagram of an image sensor 1000 according to an example embodiment.

Referring to FIG. 1, the image sensor 1000 may include a plurality of pixels 100 according to an example embodiment. Each pixel 100 may correspond to a picture element of images outputted from the image sensor 1000. The number of pixels 100 included in the image sensor 1000 may vary depending on a resolution of the image sensor 1000.

Figure 2:
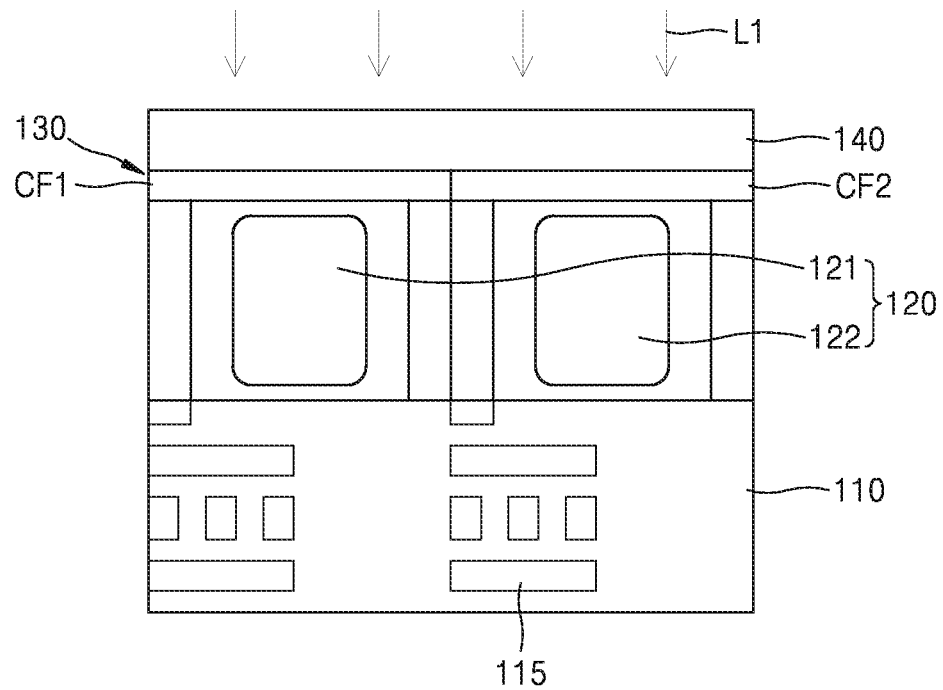
FIG. 2 is a cross-sectional view of a pixel of the image sensor of FIG. 1, according to an example embodiment.

FIG. 2 is a cross-sectional view of the pixel 100 of the image sensor 1000 of FIG. 1, according to an example embodiment.

Referring to FIG. 2, each pixel 100 of the image sensor 1000 may include a first light sensor layer 120 including a plurality of first and second light sensing cells 121 and 122 sensing an incident light and generating electrical signals, a color filter array layer 130 placed over the first light sensor layer 120 and including a plurality of first and second color filters CF1 and CF2 respectively facing each of the plurality of light sensing cells, and a second light sensor layer 140 placed over the first and second color filters CF1 and CF2, sensing light, and generating an electrical signal.

The plurality of first and second light sensing cells 121 and 122 included in the first light sensor layer 120 may be respectively independently driven and generate electrical signals proportional to an intensity of light incident on corresponding elements. The first and second light sensing cells 121 and 122 may include inorganic photo diodes. However, the example embodiment is not limited thereto. The first and second light sensing cells 121 and 122 may include, in example embodiments, charge-coupled device (CCD) sensors or complementary metal-oxide semiconductor (CMOS) sensors. The first and second light sensing cells 121 and 122 may sense the incident light regardless of a wavelength of the incident light. The first and second light sensing cells 121 and 122 may generate electrical signals in accordance with an intensity of the sensed incident light.

In addition, partition walls comparting the plurality of first and second light sensing cells 121 and 122 may be further arranged in the first light sensor layer 120. The partition wall may prevent light obliquely incident on the first and second color filter CF1 and CF2 from progressing incorrectly in a direction in which no light sensing cells respectively corresponding to the first and second color filters CF1 and CF2 exist. In example embodiments, light incident on the first color filter CF1 may be prevented from incorrectly progressing toward the second light sensing cell 122 instead of the first light sensing cell 121. In other words, the partition walls may reduce cross-talk between adjacent light sensing cells.

In addition, a wiring layer 110 for reading electrical signals generated in the first light sensor layer 120 may be under the first light sensor layer 120. The wiring layer 110 may include a plurality of metal wires 115. An arrangement type of the wiring layer 110 as illustrated is referred to as a back side illumination (BSI) type. When the pixels 100 of the image sensor 1000 are of the BSI type, a moving path of light between the first and second color filters CF1 and CF2 and the first light sensor layer 120 may be reduced. Thus, a volume of the pixels 100 may be reduced and diffusion of light signals in the wiring layer 110 may be prevented.

A color filter array layer 130 including the plurality of first and second color filters CF1 and CF2 may be on the first light sensor layer 120. Each of the plurality of first and second color filters CF1 and CF2 may respectively face each of the plurality of first and second light sensing cells 121 and 122. In example embodiments, the first color filter CF1 may face the first light sensing cell 121. In addition, the second color filter CF2 may face the second light sensing cell 122. The first color filter CF1 may filer the wavelength of light incident on the first light sensing cell 121 and the second color filter CF2 may filter the wavelength of light incident on the second light sensing cell 122. In example embodiments, the first color filter CF1 may selectively transmit light having a first color among the incident light. In addition, the second color filter CF2 may selectively transmit light having a second color. Accordingly, the first light sensing cell 121 may sense light having the first color and the second light sensing cell 122 may sense light having the second color. In example embodiments, the color filter array layer 130 may further include a third color filter selectively transmitting light a third color. In example embodiments, the first through third color may be any one color of red color, green color, and blue color. In example embodiments, a fourth color filter selectively transmitting light having a fourth color may be further included. In example embodiments, the first through third color may correspond to cyan, yellow, and magenta. However, the color correspondence is not limited thereto.

The second light sensor layer 140 may be on the color filter array layer 130. The second light sensor layer 140 may sense light having a color among incident light L1 and transform the light having the color to an electrical signal. In example embodiments, the second light sensor layer 140 may include an organic photo diode. The organic photo diode may include an organic photoelectric element capable of selectively absorbing the light having the color as a p-type and a fullerence or a fullerene dielectric as an n-type. However, the example embodiment is not limited thereto. In addition, the second light sensor layer 140 may include another sensor composition capable of sensing the light having the color and transforming the light having the color to an electrical signal. In example embodiments, the second light sensor layer 140 may sense color light that has not been filtered by the color filter array layer 130 and generating an electrical signal. In example embodiments, when the color filter array layer 130 filters light having the red color, light having the green color, and light having the blue color, the second light sensor layer 140 may sense light having wavelengths different from those of the red color, the green color, and the blue color. Thus, components of the red color, the green color, and the blue color of the incident light L1 may be incident on the color filter array layer 130 and be sensed by the first light sensor layer 120.

Figure 3:
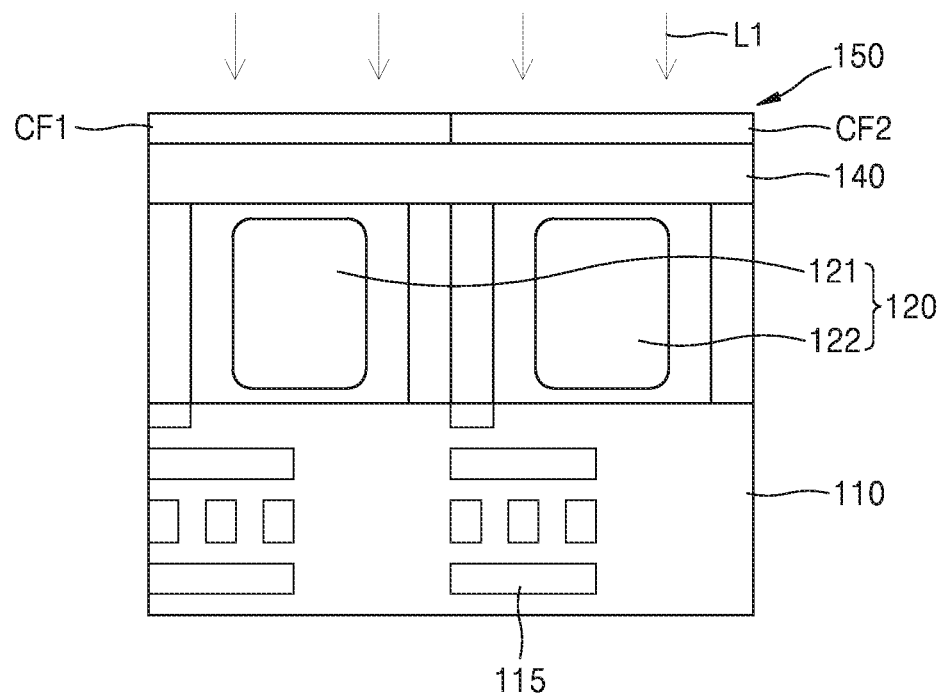
FIG. 3 is a cross-sectional view of the pixel of the image sensor of FIG. 1, according to another example embodiment.

FIG. 3 is a cross-sectional view of the pixel 100 of the image sensor 1000 of FIG. 1, according to another example embodiment.

Referring to FIG. 3, the pixel 100 of the image sensor 1000 may include the first light sensor layer 120 including the plurality of first and second light sensing cells 121 and 122 sensing light and generating electrical signals, the second light sensor layer 140 being on the first light sensor layer 120, sensing light, and generating an electrical signal, and a color filter array layer 150 being on the second light sensor layer 140 and including the plurality of first and second color filters CF1 and CF2 corresponding to each of the plurality of light sensing cells.

In the example embodiment of FIG. 3, unlike that of FIG. 2, the color filter array layer 150 may be on the second light sensor layer 140. Accordingly, light incident on the second light sensor layer 140 may be filtered by the plurality of first and second color filters CF1 and CF2 of the color filter array layer 150.

Each of the plurality of first and second color filters CF1 and CF2 may correspond to each of the plurality of first and second light sensing cells 121 and 122. In example embodiments, the first color filter CF1 may be on the first light sensing cell 121. In addition, the second color filter CF2 may be on the second light sensing cell 122. The first color filter CF1 may filter the wavelength of light incident on the first light sensing cell 121 and the second color filter CF2 may filter a wavelength of light incident on the second light sensing cell 122.

Each of the plurality of first and second color filters CF1 and CF2 may be a complementary filter that selectively absorbs or reflects the light having the color. In example embodiments, the first color filter CF1 may selectively absorb or reflect light having the first color light. In addition, the second color filter CF2 may selectively absorb or reflect light having the second color. In addition, the second light sensor layer 140 may sense light having the third color light and transform the third color light to an electrical signal. In example embodiments, the second light sensor layer 140 may include the organic photo diode. The organic photo diode may include an organic photoelectric element capable of absorbing selectively the light having the color as a p-type and a fullerenes or a fullerene dielectric as an n-type. However, the example embodiment is not limited thereto. In addition, the second light sensor layer 140 may include other sensor composition capable of sending the light having the color and transforming the light having the color to an electrical signal.

The first through third colors may be different from each other. In example embodiments, the first through third colors may correspond to any one color of the red color, the green color, and the blue color. In example embodiments, the first through third colors may also correspond to any one color of cyan, yellow, and magenta.

In example embodiments, the first color filter CF1 may selectively absorb or reflect red color light. In addition, the second color filter CF2 may selectively absorb or reflect blue color light. In addition, the second light sensor layer 140 may sense green color light and generate an electrical signal. Because the red color light is filtered in the first color filter CF1 and the green color light is sensed by the second light sensor layer 140, the first light sensing cell 121 may sense the blue color light. In addition, because the blue color light is filtered in the second color filter CF2 and the green color light is sensed by the second light sensor layer 140, the second light sensing cell 122 may sense the red color light. In other words, the second light sensor layer 140, and the first and second light sensing cells 121 and 122 may respectively sense lights having different colors from each other, and thus, a color image of the pixel 100 may be outputted.

In example embodiments, the color filter array layer 130 in the pixel 100 of the image sensor 1000 may include a nanostructure to the plurality of first and second color filters CF1 and CF2 for reducing thickness thereof. In other words, each of the plurality of first and second color filters CF1 and CF2 may include a nanostructure that includes two materials having different refractive indices from each other, being repeatedly arranged at a period. Below, detailed descriptions on this issue will be provided with reference to FIG. 4.

Figure 4:
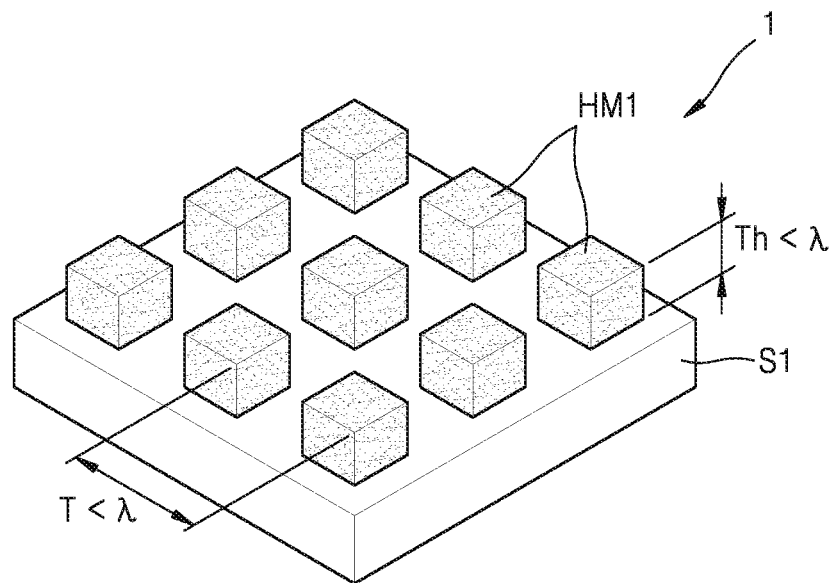
FIG. 4 is a perspective view of a color filter for use in a pixel of an image sensor, according to an example embodiment.

FIG. 4 is a perspective view of a color filter 1 for use in the first and second color filters CF1 and CF2 included in the pixel 100 of the image sensor 1000, according to an example embodiment.

The color filter 1 may include high refractive index materials HM1 repeatedly arranged at a period T on a substrate S1. The high refractive index materials HM1 are illustrated as having a hexahedral block shape. However, the example embodiment is not limited thereto, and may have various shapes such as a polyhedral pillar and a cylinder. In addition, the high refractive index materials HM1 are illustrated as being two-dimensionally arranged with rows and columns aligned each other, but the high refractive index materials HM1 on each row or column may be zigzagged from each other.

An area between the high refractive index materials HM1 may be an empty space, in example embodiments, a space including air, and include a structure in which the high refractive index materials HM1 and a low refractive index material, that is, the air are alternately arranged. This structure may transmit light having a wavelength that is determined by a difference between refractive indices of the high refractive index material HM1 and the low refractive index material, the period T, the shape, thickness of the high refractive index material HM1, etc., and may absorb or reflect other remaining lights.

The first and second color filters CF1 and CF2 of the pixel 100 of FIG. 4 may include the structure of the color filter 1 illustrated in FIG. 4. In addition, the nanostructures of the first and second color filters CF1 and CF2 may be different from each other in any one or any combination of the period T, the material, the shape, and thickness such that the first color filter CF1 transmits light having the first color and the second color filter CF2 transmits light having the second color. In example embodiments, the material and the shape of the high refractive index material HM1 may be same in the first and second color filters CF1 and CF2, while the period T or a thickness Th of the first and second color filters CF1 and CF2 may be differently controlled such that a selection of wavelength ranges is respectively controlled.

The period T may be less than a wavelength A of light transmitted by the first and second color filters CF1 and CF2 and may be, in example embodiments, equal to or less than about ⅔ or about ½ of the wavelength A. The thickness Th of the high refractive index material HM1 may be less than the wavelength A, in example embodiments, being equal to or less than about ½ of the wavelength A. Herein, the wavelength λ may denote a center wavelength of a wavelength range selected for being transmitted, absorbed, or reflected.

In example embodiments below, a structure including a high refractive index material and a low refractive material having a period and thickness less than a wavelength will be denoted as a nanostructure.

The high refractive index material HM1 may include any one of single crystal silicon, polycrystalline silicon, amorphous silicon, silicon nitride ($Si_3N_4$), gallium phosphide (GaP), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

The substrate S1 may be a supporting member for forming the nanostructure. The substrate S1 may include a material having a less refractive index than the high refractive index material HM1. In example embodiments, the substrate S1 may include any one of polymers such as polycarbonate (PC), polystyrene (PS), and polymethyl methacrylate (PMMA), and $SiO_2$.

Figure 5:
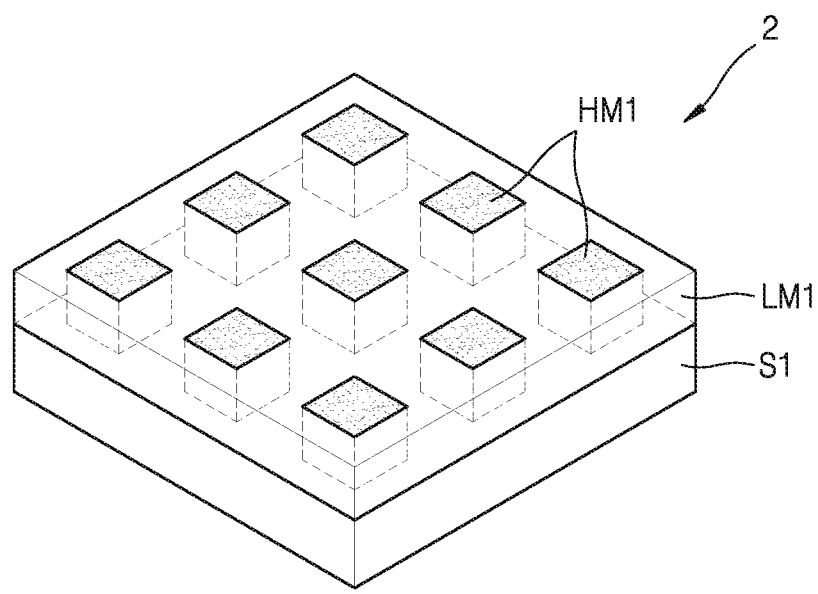
FIG. 5 is a perspective view of a color filter for use in a pixel of an image sensor, according to another example embodiment.

FIG. 5 is a perspective view of a color filter 2 for use in the pixel 100 of the image sensor 1000, according to another example embodiment.

The color filter 2 may include the substrate S1, the high refractive index materials HM1 periodically repeatedly arranged on the substrate 1, and a low refractive index material LM1 filling the area between the high refractive index materials HM1. This structure may be formed in a shape in which a plurality of through-holes TH are formed in the low refractive index material LM1 and the high refractive index materials HM1 fill the inside of the through-holes. According to another example embodiment, after pillars having the high refractive index materials HM1 have been formed, the low refractive index material LM1 may fill the space between the high refractive index materials HM1.

The low refractive index material LM1 may include a material having a less refractive index than the high refractive index material HM1. As an example, the refractive index of the high refractive index material HM1 may be greater than that of the low refractive index material LM1 by a factor of about 1.5 or more. However, the example embodiment is not limited thereto. In example embodiments, the low refractive index material LM1 may include any one of polymers such as Polydimethylsiloxane (PDMS), SU-8, hydrogen silsesquioxane (HSQ), and PMMA, and $SiO_2$.

The substrate S1 may include a material having a less refractive index than the high refractive index material HM1. In example embodiments, the substrate may include any one of polymers such as PDMS, SU-8, HSQ, and PMMA, and $SiO_2$. The substrate S1 and the low refractive index material LM1 may include same materials or different materials from each other.

Figure 6:
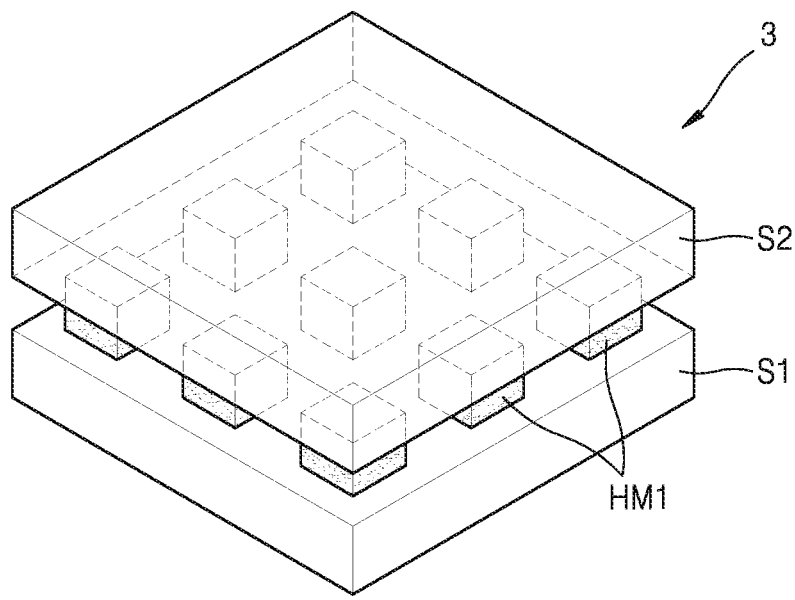
FIG. 6 is a perspective view of a color filter for use in a pixel of an image sensor, according to another example embodiment.

FIG. 6 is a perspective view of a color filter 3 for use in the pixel 100 of the image sensor 1000, according to another example embodiment.

In example embodiments, the color filter 3 may be different from the color filter 1 illustrated in FIG. 4 from a point that a substrate S2 is further arranged on the high refractive index materials HM1. The substrate S2 may include a material having a less refractive index than the high refractive index material HM1, in example embodiments, any one of polymers such as PDMS, SU-8, HSQ, and PMMA, and $SiO_2$.

Figure 7:
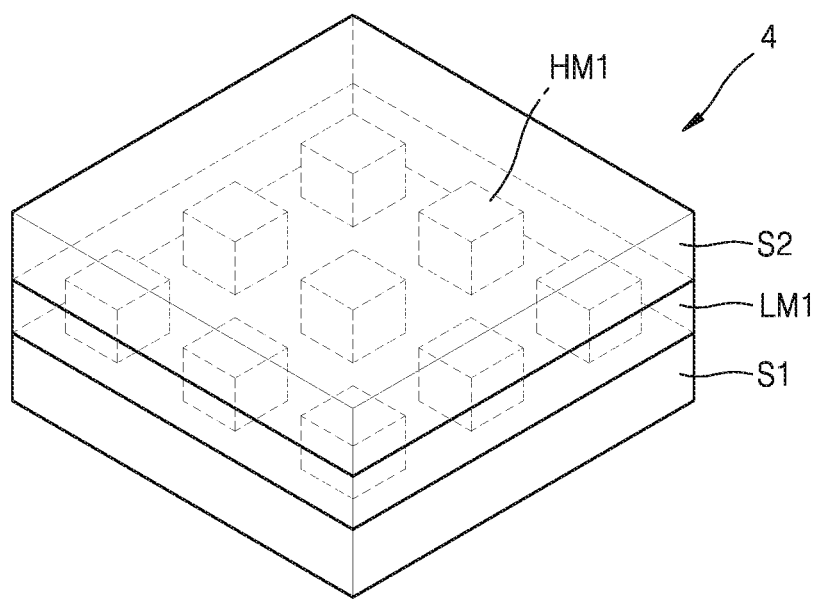
FIG. 7 is a perspective view of a color filter for use in a pixel of an image sensor, according to another example embodiment.

FIG. 7 is a perspective view of a color filter 4 for use in the pixel 100 of the image sensor 1000, according to another example embodiment.

In example embodiments, the color filter 4 may be different from the color filter 2 illustrated in FIG. 5 from a point that the substrate S2 is further arranged on the high refractive index materials HM1. The substrate S2 may include a material having a less refractive index than the high refractive index material HM1, in example embodiments, any one of polymers such as PDMS, SU-8, HSQ, and PMMA, and $SiO_2$. The substrate S2 and the low refractive index material LM1 may include same materials or different materials from each other.

Figure 8:
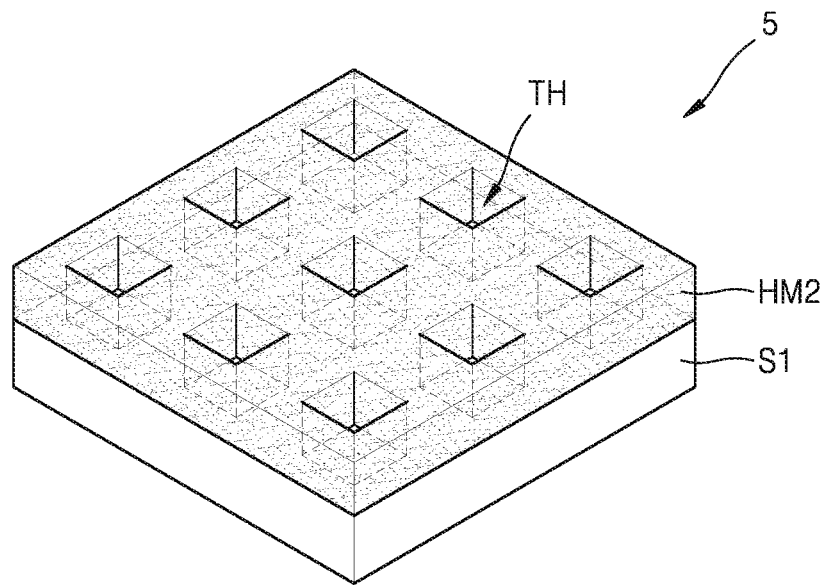
FIG. 8 is a perspective view of a color filter for use in a pixel of an image sensor, according to another example embodiment.

FIG. 8 is a perspective view of a color filter 5 for use in the pixel 100 of the image sensor 1000, according to another example embodiment.

The color filter 5 may include the substrate S1 and a high refractive index material HM2 having the plurality of through-holes TH therein. The through-hole TH may be an empty space, in example embodiments, an air space. The high refractive index material HM2 may include any one of single crystal silicon, polycrystalline silicon, amorphous silicon, $Si_3N_4$, GaP, $TiO_2$, AlSb, AlAs, AlGaAs, AlGaInP, BP, and $ZnGeP_2$. The nanostructure having the low refractive index material and the high refractive index material alternately arranged therein may be formed by the air and the high refractive index material HM2.

Figure 9:
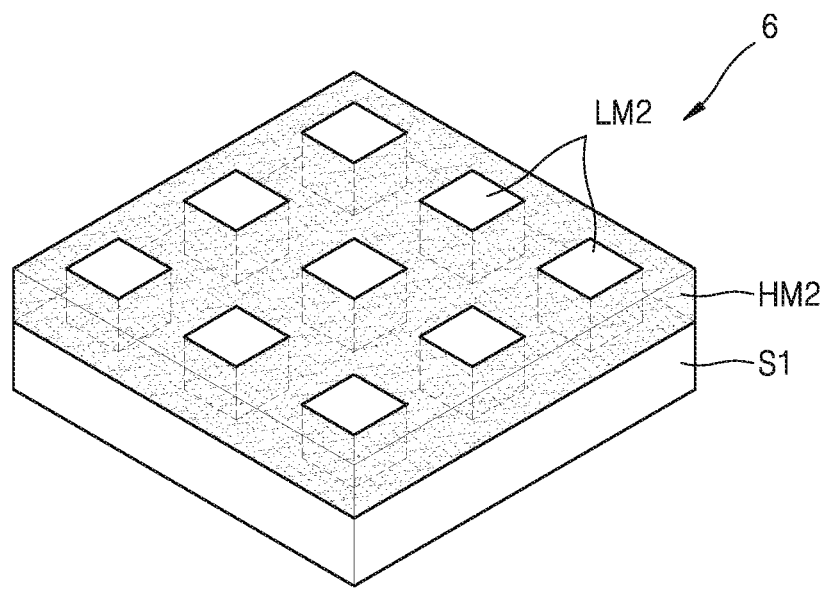
FIG. 9 is a perspective view of a color filter for use in a pixel of an image sensor, according to another example embodiment.

FIG. 9 is a perspective view of a color filter 6 for use in the pixel 100 of the image sensor 1000, according to another example embodiment.

The color filter 6 may be different from the color filter 5 of FIG. 8 from a point that the through-holes TH of the color 5 of FIG. 8 are filled with a low refractive index material LM2. The low refractive index material LM2 may include a material having a less refractive index than the high refractive index material HM2, in example embodiments, any one of polymers such as PDMS, SU-8, HSQ, and PMMA, and $SiO_2$.

Figure 10:
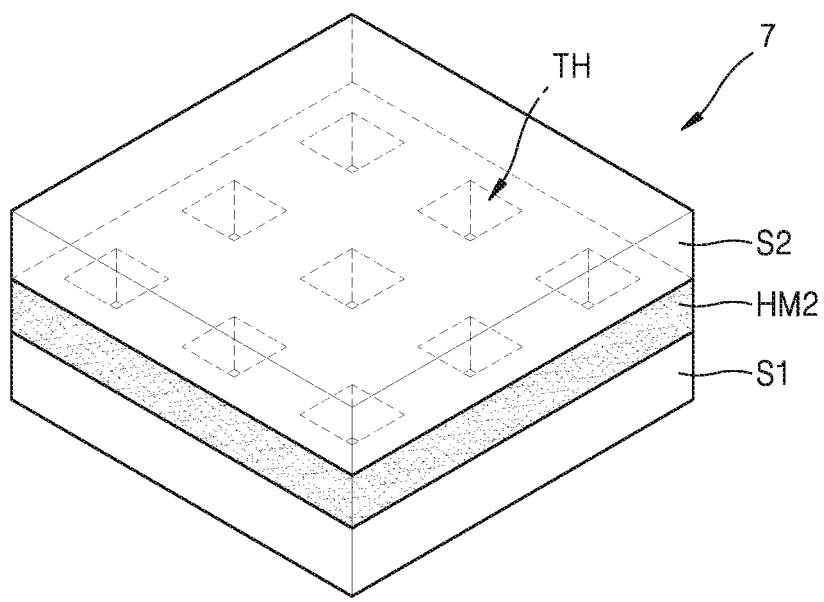
FIG. 10 is a perspective view of a color filter for use in a pixel of an image sensor, according to another example embodiment.

FIG. 10 is a perspective view of a color filter 7 for use in the pixel 100 of the image sensor 1000, according to another example embodiment.

In example embodiments, the color filter 7 may be different from the color filter 5 illustrated in FIG. 8 from a point that the substrate S2 is further arranged on the high refractive index materials HM2.

Figure 11:
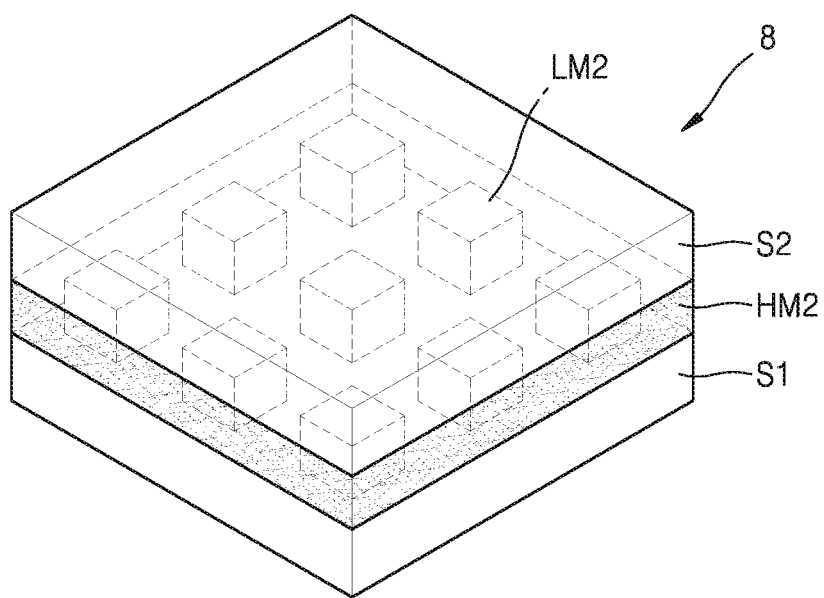
FIG. 11 is a perspective view of a color filter for use in a pixel of an image sensor, according to another example embodiment.

FIG. 11 is a perspective view of a color filter 8 for use in the pixel 100 of the image sensor 1000, according to another example embodiment.

In example embodiments, the color filter 8 may be different from the color filter 6 illustrated in FIG. 9 from a point that the substrate S2 is further arranged on the high refractive index materials HM2.

Figure 12:
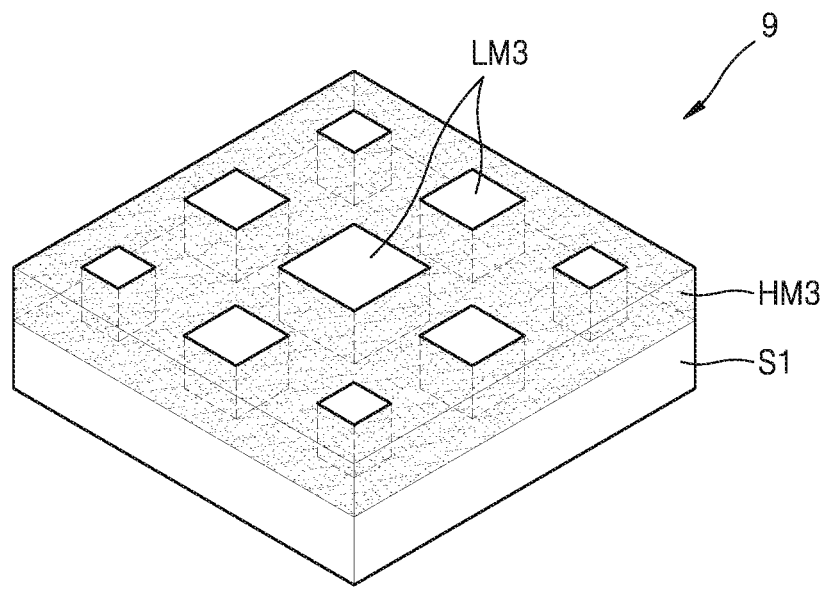
FIG. 12 is a perspective view of a color filter for use in a pixel of an image sensor, according to another example embodiment.

FIG. 12 is a perspective view of a color filter 9 for use in the pixel 100 of the image sensor 1000, according to another example embodiment.

The color filter 9 according to an example embodiment may be different from other color filters according to other example embodiments from a point that the fill factor is not uniform. The fill factor may be an area ratio of a high refractive index material HM3 in the nanostructure and denote a ratio of an area of the high refractive index material HM3 over an entire area based on a light receiving area, that is, an area in parallel with the substrate S1.

The high refractive index material HM3 may include any one of single crystal silicon, polycrystalline silicon, amorphous silicon, $Si_3N_4$, GaP, $TiO_2$, AlSb, AlAs, AlGaAs, AlGaInP, BP, and $ZnGeP_2$. A low refractive index material LM3 may include a material having a less refractive index than the high refractive index material HM3, in example embodiments, any one of polymers such as PDMS, SU-8, HSQ, and PMMA, and $SiO_2$.

When the light having the wavelength among the incident light is transmitted, directivity thereof may be controlled by controlling the fill factor. In example embodiments, when light is incident on the first light sensor layer 120 in FIG. 2 after having transmitted the color filter 9, a light collecting effect toward corresponding light sensing cells may be enhanced. FIG. 12 illustrates that an area occupied by the low refractive index material LM3 at a center portion is increased for reducing the fill factor and that the area occupied by the low refractive index material LM3 on a periphery is reduced for increasing the fill factor. However, the illustration is an example of controlling the directivity of transmitted light by controlling the fill factor, and the example embodiment is not limited thereto. In example embodiments, shapes and arrangements of the material having the first refractive index and the material having the second refractive index may be determined such that the nanostructure collects light incident thereon. Because the nanostructure performs a function of collecting light, a micro-lens may be omitted in the pixel 100 of the image sensor 1000.

A change in the fill factor may vary depending on which one of the pixels 100 the color filter is included in. In other words, the fill factor and the shape of the nanostructure of the color filter 9 included in the pixel 100 may vary depending on a location of the pixel 100. A difference in the incident angle of the incident light with respect to the location of the pixel 100 may be corrected by varying the fill factor and the shape of the nanostructure of the color filter 9 included in the pixel 100 with respect to the location of the pixel 100.

The color filter 9 of FIG. 12 is illustrated as having a different fill factor from that of the color filter 6 of FIG. 8, but this illustration is an example and the change in the fill factor may be similarly applied to the color filters 1 through 8 in FIGS. 4 through 11.

Referring to FIGS. 4 through 12, examples of two-dimensional alternate arrangements of the material having the first refractive index and the material having the second refractive index are illustrated. Two-dimensional directions may vary depending on the location of the pixel 100. In other words, an arrangement direction of the nanostructure may vary as two directions forming the two-dimension in the nanostructure vary depending on the location of the pixel 100. The difference in the incident angle of the incident light with respect to the location of the pixel 100 may be corrected by varying the two directions forming the two-dimension in the nanostructure.

Figure 13:
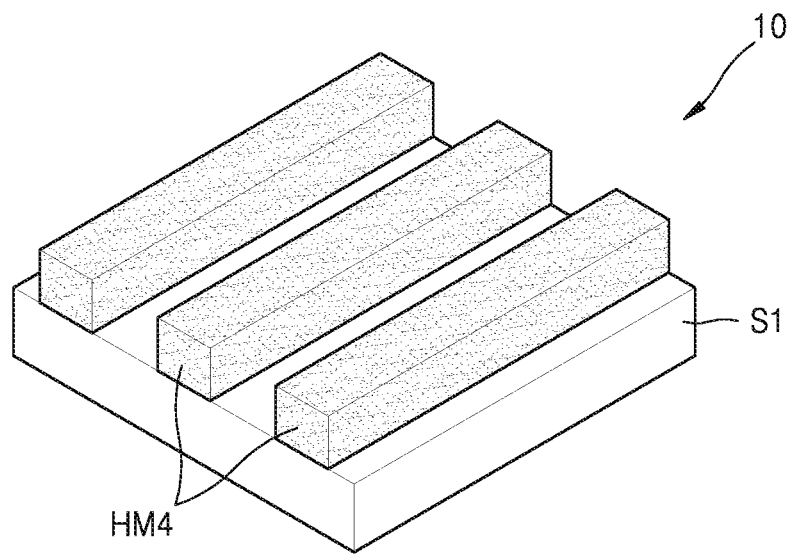
FIG. 13 is a perspective view of a color filter for use in a pixel of an image sensor, according to another example embodiment.

FIG. 13 is a perspective view of a color filter 10 for use in the pixel 100 of the image sensor 1000, according to another example embodiment.

The color filter 10 may be different from previously-described example embodiments from a point that a high refractive index material HM4 is one-dimensionally repeatedly arranged. The high refractive index material HM4 may have a protruding type in a stripe shape and be repeatedly arranged in a direction different from the stripe direction. In example embodiments, the stripe shape may be repeatedly arranged in a direction perpendicular to the stripe direction. However, the example embodiment is not limited thereto. An area between the high refractive index materials HM4 may be an empty space, that is, the air space. The high refractive index material HM4 may include any one of single crystal silicon, polycrystalline silicon, amorphous silicon, $Si_3N_4$, GaP, $TiO_2$, AlSb, AlAs, AlGaAs, AlGaInP, BP, and $ZnGeP_2$.

Figure 14:
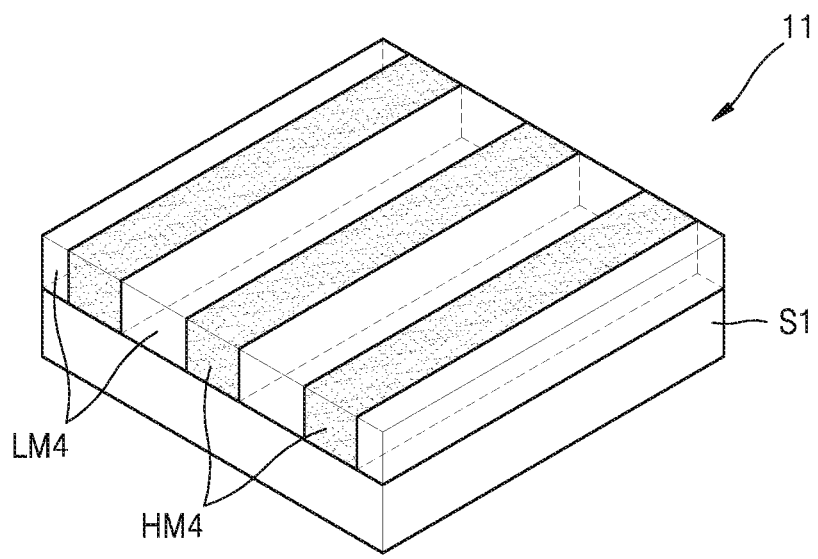
FIG. 14 is a perspective view of a color filter for use in a pixel of an image sensor, according to another example embodiment.

FIG. 14 is a perspective view of a color filter 11 for use in the pixel 100 of the image sensor 1000, according to another example embodiment.

The color filter 11 according to an example embodiment may be different from the color filter 10 of FIG. 13 from a point that the area between the high refractive index materials HM4 is filled with a low refractive index material LM4. The low refractive index material LM4 may include a material having a less refractive index than the high refractive index material HM4, in example embodiments, any one of polymers such as PDMS, SU-8, HSQ, and PMMA, and $SiO_2$.

Figure 15:
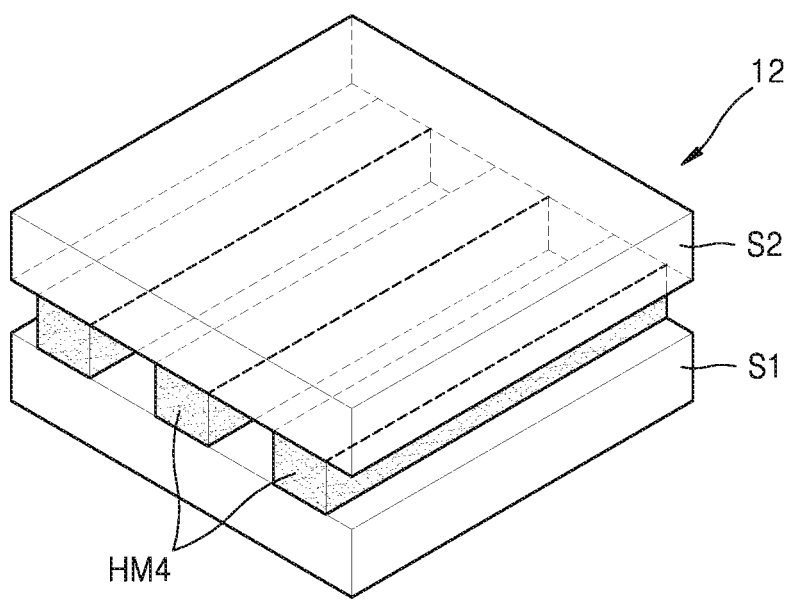
FIG. 15 is a perspective view of a color filter for use in a pixel of an image sensor, according to another example embodiment.

FIG. 15 is a perspective view of a color filter 12 for use in the pixel 100 of the image sensor 1000, according to another example embodiment.

The color filter 12 according to an example embodiment may be different from the color filter 10 of FIG. 13 from a point that the substrate S2 is further arranged on the high refractive index material HM4.

Figure 16:
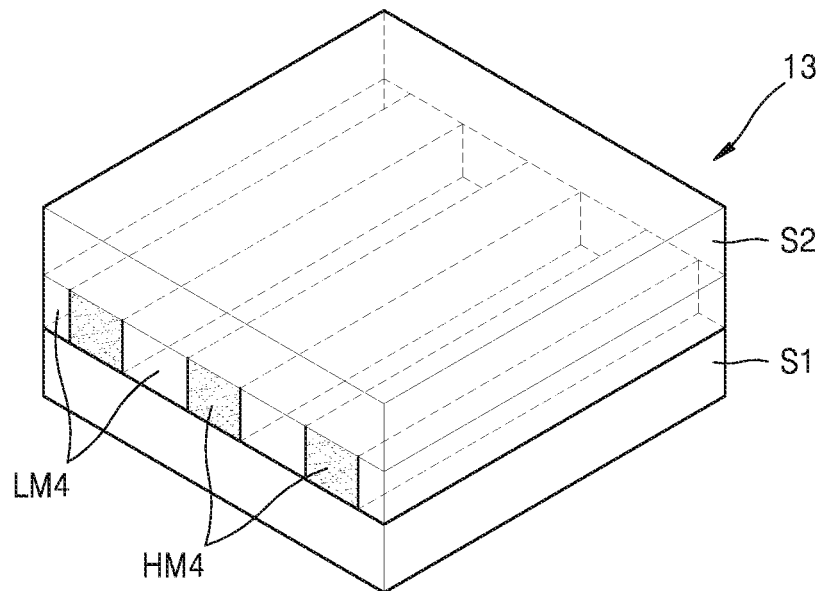
FIG. 16 is a perspective view of a color filter for use in a pixel of an image sensor, according to another example embodiment.

FIG. 16 is a perspective view of a color filter 13 for use in the pixel 100 of the image sensor 1000, according to another example embodiment.

The color filter 13 according to an example embodiment may be different from the color filter 11 of FIG. 14 from a point that the substrate S2 is further arranged on the high refractive index material HM4.

Referring to FIGS. 13 through 16, the material having the second refractive index may form a structure having the stripe shape in the nanostructure of the color filters 10 through 13 and the structure having the stripe shape may be one-dimensionally repeatedly arranged. A longitudinal direction of the structure having the stripe shape may vary with respect to the pixel 100. In other words, the arrangement direction of the nanostructure may vary as the longitudinal direction of the structure having the stripe shape in the nanostructure varies with respect to the location of the pixel 100. The difference in the incident angle of the incident light with respect to the location of the pixel 100 may be corrected by varying the longitudinal direction of the structure having the stripe shape in the nanostructure with respect to the pixel 100.

Figure 17:
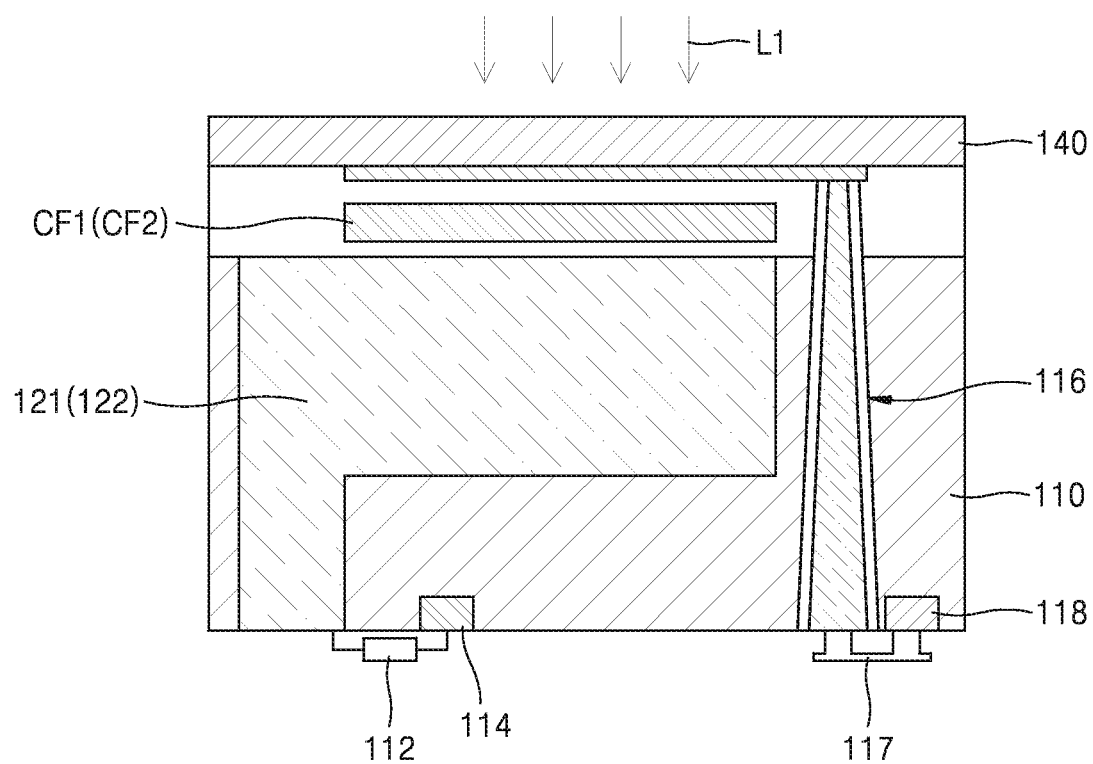
FIG. 17 is a diagram of another structure included in an area corresponding to one of light sensing cells in the cross-sectional view of the pixel illustrated in FIG. 2, according to an example embodiment.

FIG. 17 is a diagram of another structure included in an area corresponding to one of the first and second light sensing cells 121 and 122 in the cross-sectional view of the pixel 100 illustrated in FIG. 2, according to an example embodiment.

Referring to FIG. 17, the incident light L1 may be incident on the second light sensor layer 140. The second light sensor layer 140 may sense the light having the first color. When the second light sensor layer 140 senses the light having the first color, the second light sensor layer 140 may accumulate electric charges generated via a photoelectric effect. The electrical signal may be transferred by a movement of the electrical charges generated in the second light sensor layer 140. In example embodiments, a through-channel 116 may be under the second light sensor layer 140 for the movement of the electrical charges. The through-channel 116 may pass through the wiring layer 110. The through-channel 116 may be connected to a wire 118 on a bottom side of the wiring layer 110 via a gate 117. The electrical signal generated in the second light sensor layer 140 may be transferred to the wire 118 on the bottom side of the wiring layer 110 via the through-channel 116. In addition, the electrical signal generated in the first and second light sensing cells 121 and 122 may be transferred to a wire 114 on the bottom side of the wiring layer 110 via a transfer gate 112.

According to the above example embodiments, because optical characteristics of a color filter of an image sensor are determined by a period, shape, an arrangement, etc. of a nanostructure, a proper structure condition for a wavelength or an incident angle may be derived. Thus, wavelength selectivity may be enhanced and controlling color bandwidth may be easy. In addition, thickness of the color filter may be less than the wavelength of light by realization of the color filter having a nanostructure. Thus, a micro-lens may be omitted from pixels of the image sensor by designing the nanostructure in a way that the color filter functions as the micro-lens. Accordingly, the pixel of the image sensor may be miniaturized.

Descriptions on the image sensor 1000 according to the above example embodiments have been provided with reference to FIGS. 1 through 17. According to the above example embodiments, because the optical characteristics of the color filter included in the image sensor 1000 are determined by the period, the shape, the arrangement, etc. of the nanostructure, the structure suitable for the wavelength or the incident angle may be determined. Thus, the wavelength selectivity may be enhanced and controlling color bandwidth may be easy. In addition, the thickness of the color filter may be less than the wavelength of light by realization of the color filter having the nanostructure. Thus, the micro-lens may be omitted from the pixel 100 of the image sensor 1000 by designing the nanostructure in a way that the color filter functions as the micro-lens. Accordingly, the pixel 100 of the image sensor 1000 may be miniaturized.

It may be understood that example embodiments described herein may be considered in a descriptive sense only and not for purposes of limitation. Descriptions of features or aspects within each example embodiment may typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. An image sensor comprising:
   a first light sensor layer comprising light sensing cells configured to sense light that is incident on the light sensing cells, and generate electrical signals based on the sensed light that is incident on the light sensing cells;
   a color filter array layer disposed on the first light sensor layer, and comprising color filters respectively facing the light sensing cells; and
   a second light sensor layer disposed on the color filter array layer, and configured to sense light that is incident on the second light sensor layer, and generate an electrical signal based on the sensed light that is incident on the second light sensor layer,
   wherein the light sensed by the second light sensor layer has a first color,
   each of the color filters comprises a nanostructure comprising first materials having a first refractive index, and second materials having a second refractive index greater than the first refractive index, the first materials and the second materials being alternately disposed with a period,
   the color filters comprise a first color filter configured to selectively transmit light having a second color, and a second color filter configured to selectively transmit light having a third color,
   the first color, the second color, and the third color are different from each other,
   the color filter array layer performs a function of collecting light,
   the period is less than a wavelength of light that is incident on the color filter array layer, and
   each of a thickness of the first materials and a thickness of the second materials is less than the wavelength of the light that is incident on the color filter array layer.

2. The image sensor of claim 1, wherein the first color filter and the second color filter respectively comprise nanostructures having different periods.

3. The image sensor of claim 1, wherein each of the first color filter and the second color filter performs a function of collecting light.

4. The image sensor of claim 1, wherein the color filter array layer further comprises a first substrate comprising a third material having a third refractive index less than the second refractive index, and
   the nanostructure is disposed on the first substrate.

5. The image sensor of claim 4, wherein the color filter array layer further comprises a second substrate comprising a fourth material having a fourth refractive index less than the second refractive index, and
   the nanostructure is interposed between the first substrate and the second substrate.

6. The image sensor of claim 1, wherein the first materials comprise one of polymer and silicon dioxide ($SiO_2$), and
   the second materials comprises one of silicon (Si), silicon nitride ($Si_3N_4$), gallium phosphide (GaP), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

7. The image sensor of claim 1, wherein the first materials and the second materials are two-dimensionally alternately disposed.

8. The image sensor of claim 1, wherein two directions of the nanostructure included in each of pixels of the image sensor vary based on a location of each of the pixels.

9. The image sensor of claim 1, wherein the second materials have a stripe shape structure that is one-dimensionally repeatedly disposed, and
   a longitudinal direction of the stripe shape structure of the nanostructure included in each of pixels of the image sensor varies based on a location of each of the pixels.

10. The image sensor of claim 1, wherein each of the light sensing cells comprises an inorganic photodiode, and
    the second light sensor layer comprises an organic photodiode.

11. The image sensor of claim 1, wherein the fill factor denotes an area ratio of the second materials included in the nanostructure included in each of pixels of the image sensor, and varies based on a location of each of the pixels.

12. The image sensor of claim 1, wherein shapes and arrangements of the first materials and the second materials are such that the nanostructure collects incident light.

13. The image sensor of claim 1, wherein the second refractive index is greater than the first refractive index by about 1.5 or more.

14. The image sensor of claim 1, wherein the nanostructure comprises through-holes disposed through the second materials, and
    the second materials comprise air spaces within the through-holes.

15. The image sensor of claim 1, wherein the nanostructure comprises through-holes disposed through the second materials, and
    the first materials are disposed within the through-holes.

16. An image sensor comprising:
    a first light sensor layer comprising light sensing cells configured to sense light that is incident on the light sensing cells, and generate electrical signals based on the sensed light that is incident on the light sensing cells;
    a second light sensor layer disposed on the first light sensor layer, and configured to sense light that is incident on the second light sensor layer, and generate an electrical signal based on the sensed light that is incident on the second light sensor layer; and
    a color filter array layer disposed on the second light sensor layer, and comprising color filters respectively corresponding to the light sensing cells,
    wherein the light sensed by the second light sensor layer has a first color,
    each of the color filters comprises a nanostructure comprising first materials having a first refractive index and second materials having a second refractive index greater than the first refractive index, the first materials and the second materials being alternately disposed with a period,
    the color filters comprise a first color filter configured to selectively absorb or reflect light having a second color, and a second color filter configured to selectively absorb or reflect light having a third color,
    the first color, the second color, and the third color are different from each other,
    the color filter array layer performs a function of collecting light,
    the period is less than a wavelength of light that is incident on the color filter array layer, and each of a thickness of the first materials and a thickness of the second materials is less than the wavelength of the light that is incident on the color filter array layer.

17. The image sensor of claim 16, wherein the first color filter and the second color filter respectively comprise nanostructures having different periods.

18. The image sensor of claim 16, wherein each of the first color filter and the second color filter performs a function of collecting light.

19. The image sensor of claim 16, wherein the color filter array layer further comprises a first substrate comprising a third material having a third refractive index less than the second refractive index, and
the nanostructure is disposed on the first substrate.

20. The image sensor of claim 19, wherein the color filter array layer further comprises a second substrate comprising a fourth material having a fourth refractive index less than the second refractive index, and
the nanostructure is interposed between the first substrate and the second substrate.

21. The image sensor of claim 16, wherein the first materials comprise one of polymer and silicon dioxide ($SiO_2$), and
the second materials comprises one of silicon (Si), silicon nitride ($Si_3N_4$), gallium phosphide (GaP), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

22. The image sensor of claim 16, wherein the first materials and the second materials are two-dimensionally alternately disposed.

23. The image sensor of claim 16, wherein two directions of the nanostructure included in each of pixels of the image sensor vary based on a location of each of the pixels.

24. The image sensor of claim 16, wherein the second materials have a stripe shape structure that is one-dimensionally repeatedly disposed, and
a longitudinal direction of the stripe shape structure of the nanostructure included in each of pixels of the image sensor varies based on a location of each of the pixels.

25. The image sensor of claim 16, wherein each of the light sensing cells comprises an inorganic photodiode, and
the second light sensor layer comprises an organic photodiode.

26. The image sensor of claim 16, wherein the fill factor denotes an area ratio of the second materials included in the nanostructure included in each of pixels of the image sensor, and varies based on a location of each of the pixels.

* * * * *